United States Patent
Nanno et al.

(10) Patent No.: US 7,256,757 B2
(45) Date of Patent: Aug. 14, 2007

(54) ORGANIC EL DISPLAY PANEL

(75) Inventors: Yutaka Nanno, Kobe (JP); Hiroshi Tsutsu, Kawasaki (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 11/136,491

(22) Filed: May 25, 2005

(65) Prior Publication Data

US 2005/0212449 A1    Sep. 29, 2005

Related U.S. Application Data

(63) Continuation of application No. PCT/JP03/14959, filed on Nov. 25, 2003.

(30) Foreign Application Priority Data

Nov. 25, 2002 (JP) .............................. 2002-341348

(51) Int. Cl.
*G09G 3/30* (2006.01)
*G09G 3/20* (2006.01)
(52) U.S. Cl. .......................................... 345/76; 345/83
(58) Field of Classification Search ................... 345/76, 345/82, 83; 315/169.3
See application file for complete search history.

(56) References Cited

U.S. PATENT DOCUMENTS 6,509,688 B1    1/2003    Bae et al.

2002/0039813 A1    4/2002    Yamazaki
2003/0122497 A1    7/2003    Ko et al.
2003/0173564 A1    9/2003    Ko et al.

FOREIGN PATENT DOCUMENTS

| JP | 2001-281704 | 10/2001 |
| JP | 2001-318628 | 11/2001 |
| JP | 2002-175029 | 6/2002 |
| JP | 2002-196704 | 7/2002 |
| KR | 10-0235475 | 12/1999 |
| KR | 2002-0036735 | 5/2002 |

*Primary Examiner*—Dennis-Doon Chow
(74) *Attorney, Agent, or Firm*—Oblon, Spivak, McClelland, Maier & Neustadt, P.C.

(57) ABSTRACT

An organic EL display panel includes a substrate, pixel electrodes, a common electrode, signal lines, power supply lines, thin-film transistors, scan lines, organic EL elements and storage capacitors. To obtain a full color image by light emissions of the organic EL elements, red, green and blue emitters are patterned correspondently with the pixel electrodes and arranged in this order along the gate line direction. The emitters are patterned such that each pair of the red, green and blue emitters which are adjacent to each other along the gate line direction overlap each other to define a light-emitting layer overlap region, where colors of light components which exit the organic EL elements and pass through the emitters are mixed, between the adjacent organic EL elements arranged along the gate line direction. At least one of the thin-film transistor and the storage capacitor is arranged in the light-emitting layer overlap region.

10 Claims, 10 Drawing Sheets

ORGANIC EL DISPLAY PANEL

CROSS-REFERENCE TO RELATED APPLICATIONS

This is a Continuation Application of PCT Application No. PCT/JP03/14959, filed Nov. 25, 2003, which was published under PCT Article 21(2) in Japanese.

This application is based upon and claims the benefit of priority from prior Japanese Patent Application No. 2002-341348, filed Nov. 25, 2002, the entire contents of which are incorporated herein by reference.

BACKGROUND OF THE INVENTION

1. Field of the Invention

The present invention relates to an organic EL display panel.

2. Description of the Related Art

As display panels capable of high-quality display and replacing liquid crystal display panels, organic EL display panels using organic EL (Electro-Luminescent) elements have received a great deal of attention.

The organic EL display panels are classified into passive display panels having a passive matrix structure in which organic EL elements emitting light are located at intersections of anodes and cathodes, and active display panels which control a direct current to be supplied to organic EL elements by using thin-film transistors (TFTs).

Figure 10A:
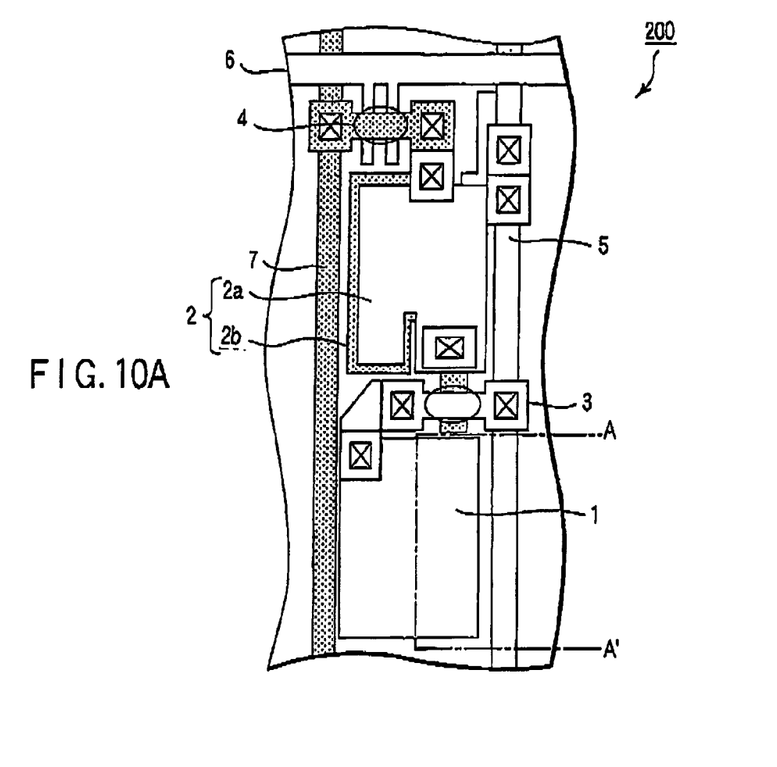
FIG. 10A is a plan view showing the structure of a unit pixel of a conventional organic EL display panel.
Figure 10B:
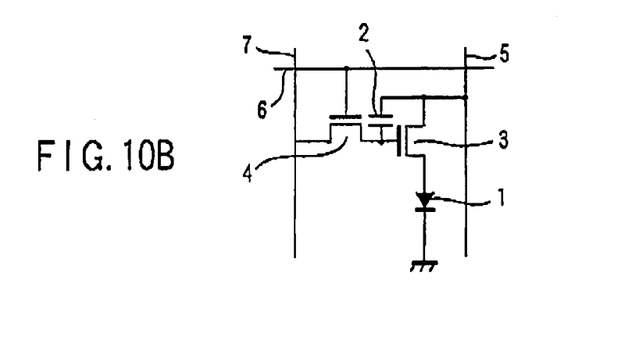
FIG. 10B is an equivalent circuit diagram of the unit pixel.

A conventional active organic EL display panel will be described below. In this organic EL display panel, unit pixels each including an organic EL element are arranged in a matrix form in a display area where an image is displayed. FIG. 10A is a plan view of a unit pixel 200 in this organic EL display panel. FIG. 10B is an equivalent circuit of the unit pixel 200.

The unit pixel 200 includes an organic EL element 1, storage capacitor 2, EL driving TFT 3, and switching TFT 4. A power supply line 5 and a signal line 7 are arranged along the vertical direction in the display area. A scan line 6 is arranged along the horizontal direction. The power supply lines 5, signal lines 7, and scan lines 6 are arranged at predetermined intervals in the display area.

Referring to FIGS. 10A and 10B, the organic EL element 1 is connected to the power supply line 5 through the EL driving TFT 3. A power supply voltage is supplied from the power supply line 5 to the organic EL element 1 through the EL driving TFT 3. A signal voltage is supplied from the signal line 7 to the gate of the EL driving TFT 3 through the switching TFT 4. A control voltage is supplied from the scan line 6 to the gate of the switching TFT 4.

Figure 11:
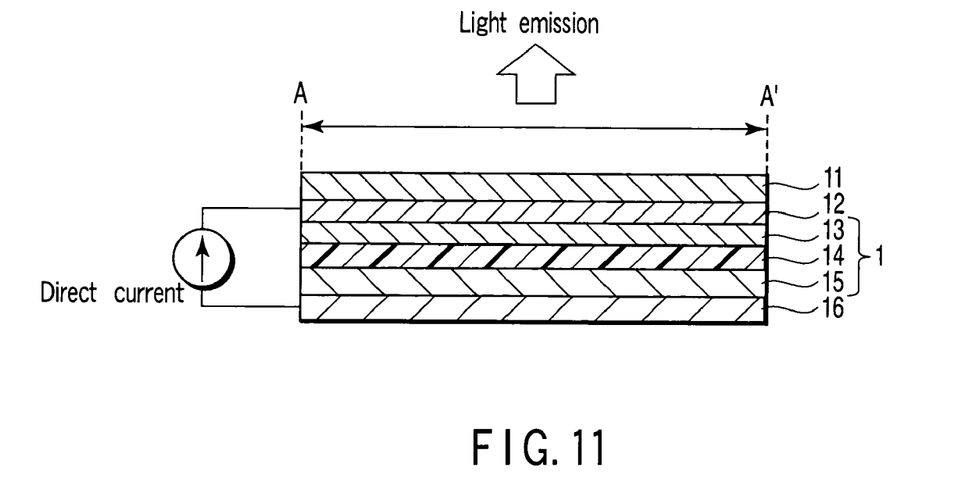
FIG. 11 is a sectional view showing the structure of a conventional organic EL element.

FIG. 11 is a sectional view taken along a line A-A' in the organic EL element 1 shown in FIG. 10A. The organic EL element 1 includes a hole transporting layer 13, light-emitting layer 14, and electron transporting layer 15. The organic EL element 1 is arranged between a pixel electrode 12 and a common electrode 16. The pixel electrode 12 made of an ITO (Indium Tin Oxide) thin film is formed on a glass substrate 11 which extends over the display area. The hole transporting layer 13, light-emitting layer 14, electron transporting layer 15, and common electrode 16 made of a metal are formed on the pixel electrode 12 in this order. When a direct current is supplied to this structure, holes are emitted from the pixel electrode 12, and electrons are emitted from the common electrode 16. The holes and electrodes recombine in the light-emitting layer 14 and excite organic molecules in the light-emitting layer 14. Accordingly, light exits in the direction indicated by an arrow in FIG. 11.

Referring to FIG. 10A, the storage capacitor 2 includes an electrode 2a and an electrode 2b facing the electrode 2a. The electrode 2a is connected to the power supply line 5. The electrode 2b is connected to the drain of the switching TFT 4. When charges are stored between the electrode 2a and the electrode 2b, a current amount necessary for causing the organic EL element 1 to emit light is set.

In the organic EL display panel, no light is emitted from the region occupied by the storage capacitor 2, EL driving TFT 3, and switching TFT 4. If the area occupied by the storage capacitor 2, EL driving TFT 3, and switching TFT 4 in the unit pixel 200 is large, as shown in FIG. 10A, the ratio of the area of the organic EL element 1 which emits light becomes low. That is, the aperture ratio (the ratio of the area occupied by the organic EL elements 1 to the area of the display area) decreases. When the aperture ratio is low, the luminance per unit pixel 200 must be increased to maintain the luminance. This is a contributing factor to shorten the life of the organic EL element 1 and, accordingly, the life of the organic EL display panel.

Jpn. Pat. Appln. KOKAI Publication No. 2000-397475 (p. 6, FIG. 2) (patent reference 1) discloses an organic EL display panel, in which the thin-film transistor and storage capacitor are superposed on the light emission surface side of the display area to increase the aperture ratio and prolong the life.

According to the technique described in patent reference 1, the area occupied by the thin-film transistor is surely not a cause of a low aperture ratio. However, the storage capacitor having a larger area still suppresses the aperture ratio low. The effect for prolonging the life of the organic EL display panel is insufficient.

The present invention has been made to solve the problem, and has as its object to provide an organic EL display panel having a longer life.

(Patent Reference 1)

Jpn. Pat. Appln. KOKAI Publication No. 2000-397475 (p. 6, FIG. 2)

BRIEF SUMMARY OF THE INVENTION

One organic EL display panel according to the present invention is characterized by comprising a substrate, pixel electrodes which are arranged in a matrix form on the substrate, a common electrode which faces the pixel electrodes, signal lines which extend along a vertical direction and are arranged in a gate line direction at a predetermined interval, power supply lines which extend along the vertical direction and are arranged in the gate line direction at a predetermined interval, scan lines which extend along the gate line direction and are arranged in the vertical direction at a predetermined interval, organic EL elements which are arranged between the pixel electrodes and the common electrode and each of which emits light when a current flows between the pixel electrode and the common electrode, first thin-film transistors each of which is connected between the power supply line and the pixel electrode, storage capacitors each of which includes a first electrode connected to a gate of the first thin-film transistor; and second thin-film transistors each of which is connected between the signal line and the gate of the first thin-film transistor, wherein, to obtain a full color image by light emissions of the organic EL elements, a red (R) emitter, a green (G) emitter and a blue (B) emitter are patterned correspondently with the pixel electrodes and arranged in this order along the gate line direction, wherein the emitters are patterned such that each pair of the red (R) emitter, the green (G) emitter and the blue (B) emitter which are adjacent to each other along the gate line direction overlap each other to define a light-emitting layer overlap region, where colors of light components which exit the organic EL elements and pass through the emitters are mixed, between the adjacent organic EL elements arranged along the gate line direction, and wherein at least one of the first thin-film transistor, the second thin film transistor and the storage capacitor is placed in the light-emitting layer overlap region.

Another organic EL display panel according to the present invention is characterized by comprising a substrate, pixel electrodes which are arranged in a matrix form on the substrate, a common electrode which faces the pixel electrodes, signal lines which extend along a vertical direction and are arranged in a gate line direction at a predetermined interval, power supply lines which extend along the vertical direction and are arranged in a gate line direction at a predetermined interval, scan lines which extend along the gate line direction and are arranged in the vertical direction at a predetermined interval, organic EL elements which are arranged between the pixel electrodes and the common electrode and each of which emits light when a current flows between the pixel electrode and the common electrode, first thin-film transistors each of which is connected between the power supply line and the pixel electrode, storage capacitors each of which includes a first electrode connected to a gate of the first thin-film transistor, and second thin-film transistors each of which is connected between the signal line and the gate of the first thin-film transistor, wherein each of the organic EL elements is placed to overlap at least one of the signal line, the power supply line, and the scan line, and wherein at least one of the first thin-film transistor, the second thin-film transistor and the storage capacitor is placed in a non-aperture region between the adjacent pixel electrodes.

Still another organic EL display panel according to the invention is characterized by comprising a substrate, pixel electrodes which are arranged in a matrix form on the substrate, a common electrode which faces the pixel electrodes, signal lines which extend along a vertical direction and are arranged in a gate line direction at a predetermined interval, power supply lines which extend along the vertical direction and are arranged in a gate line direction at a predetermined interval, scan lines which extend along the gate line direction and are arranged in the vertical direction at a predetermined interval, organic EL elements which are arranged between the pixel electrodes and the common electrode and each of which emits light when a current flows between the pixel electrode and the common electrode, storage capacitors each of which includes a first electrode connected to a gate of the first thin-film transistor, and second thin-film transistors each of which is connected between the signal line and the gate of the first thin-film transistor, wherein, to obtain a full color image by light emissions of the organic EL elements, a red (R) emitter, a green (G) emitter and a blue (B) emitter are patterned correspondently with the pixel electrodes and arranged in this order along the gate line direction, wherein the emitters are patterned such that each pair of the red (R) emitter, the green (G) emitter and the blue (B) emitter which are adjacent to each other along the gate line direction overlap each other to define a light-emitting layer overlap region with a rectangular shape extending along the vertical direction, where colors of light components which exit the organic EL elements and pass through the emitters are mixed, between the adjacent organic EL elements arranged along the gate line direction, wherein at least one of the first thin-film transistor, the second thin-film transistor and the storage capacitor is placed in the light-emitting layer overlap region, and wherein each of the organic EL elements is placed to overlap at least one of the signal line, the power supply line, and the scan line.

BRIEF DESCRIPTION OF THE SEVERAL VIEWS OF THE DRAWING

FIGS. 4A to 4F are sectional views showing steps in manufacturing the organic EL display panel according to the embodiment, in which

FIGS. 5A to 5G are sectional views showing a process of forming the storage capacitor formed in the unit pixel of the organic EL display panel according to the embodiment, in which

DETAILED DESCRIPTION OF THE INVENTION

In an organic EL display panel according to the present embodiment, of red (R) emitter, green (G) emitter, and blue (B) emitter, two emitters adjacent in the gate line direction overlap each other. Accordingly, at least one of the thin-film transistor and the storage capacitor is arranged in a light-emitting layer overlap region where the colors of light components which exit the organic EL elements and pass through the emitters are mixed. For this reason, the light emission area is not decreased by at least one of the thin-film transistor and the storage capacitor. Since the light emission area can be increased as compared to the prior art, an identical luminance can be maintained even when the light emission amount per unit area is decreased. Since the power supply amount to each pixel can be suppressed, an organic EL display panel whose organic EL element has a longer life can be provided.

In this embodiment, at least one of the thin-film transistor and the storage capacitor is preferably arranged along the vertical direction.

Preferably, the red (R) emitter, green (G) emitter, and blue (B) emitter are elongated along the vertical direction to form a stripe.

The organic EL element preferably has a rectangular shape elongated in the vertical direction. The light-emitting layer overlap region is preferably arranged along the long side direction of each organic EL element while being centered almost at the intermediate point between organic EL elements adjacent to each other.

Let P be the distance between adjacent emitters, L be the length of the emitter along the vertical direction, and S be the area occupied by at least one of the thin-film transistor and the storage capacitor. Then, $S < P \times L$ is preferably satisfied.

The distance P between the adjacent emitters preferably corresponds to the width of a rib formed between the adjacent emitters.

The storage capacitor preferably includes a first electrode which is made of polysilicon and formed integrally with the source of the thin-film transistor, a gate interconnection which runs from the signal line to the gate of the thin-film transistor, and a second electrode which is electrically connected to the power supply line at the source of the thin-film transistor. Preferably, the first electrode faces the gate interconnection, the gate interconnection faces the second electrode, and charges are stored between the first electrode and the gate interconnection and between the gate interconnection and the second electrode.

The red (R) emitter, green (G) emitter, and blue (B) emitter are preferably formed by mask evaporation.

The embodiment of the present invention will be described below with reference to the accompanying drawings.

The organic EL display panel according to this embodiment will be described. In this organic EL display panel, a plurality of unit pixels 100 including organic EL elements 1 are arranged in a matrix form in a display area where an image is displayed.

Figure 1A:
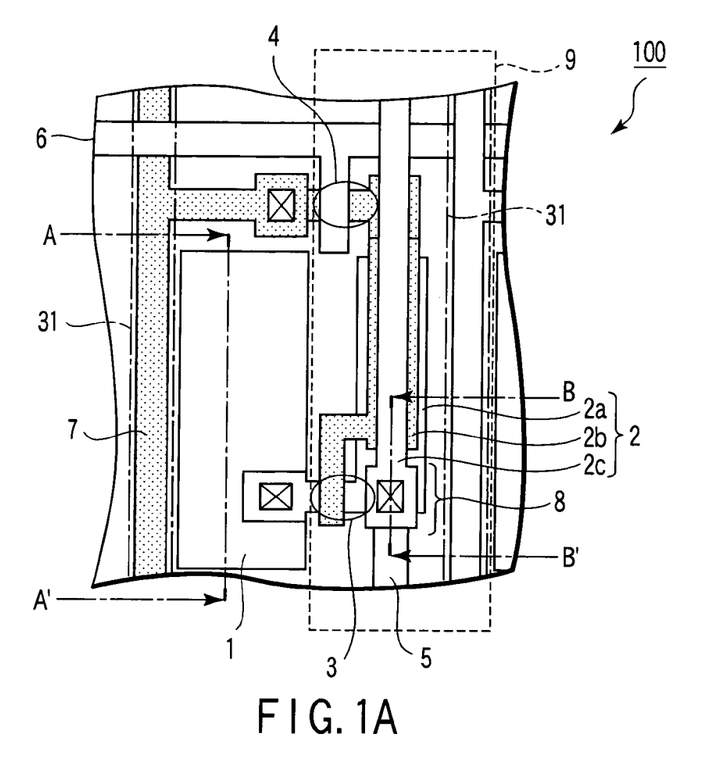
FIG. 1A is a plan view showing the structure of a unit pixel of an organic EL display panel according to an embodiment.
Figure 1B:
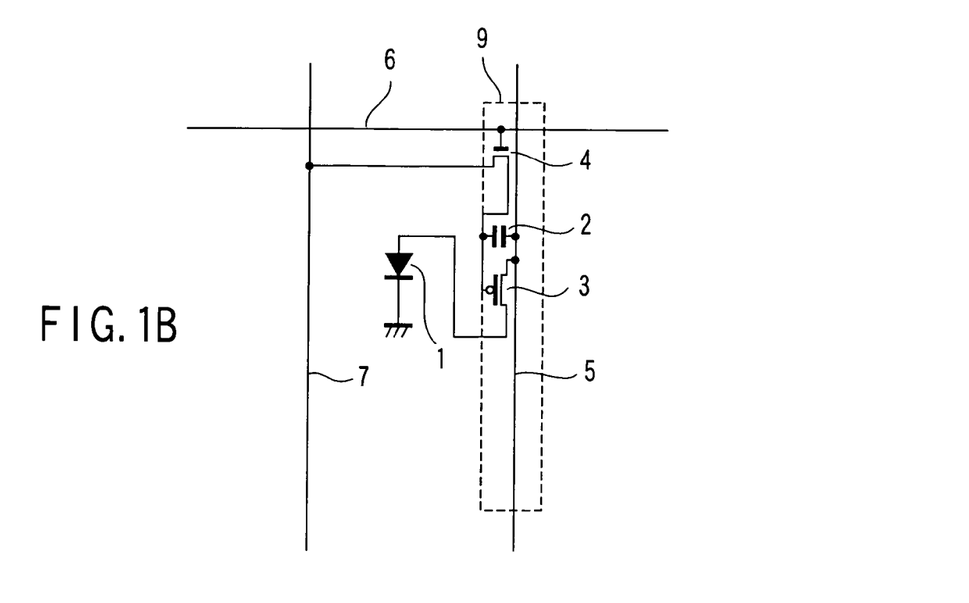
FIG. 1B is an equivalent circuit diagram of the unit pixel.

FIG. 1A is a plan view of the unit pixel 100. FIG. 1B is an equivalent circuit of the unit pixel 100. The unit pixel 100 includes the organic EL element 1, a storage capacitor 2, an EL driving TFT 3, a rib 31, and a switching TFT 4. A power supply line 5 and a signal line 7 are arranged along the vertical direction in the display area. A scan line 6 is arranged along the horizontal direction. The power supply lines 5, signal lines 7, and scan lines 6 are arranged at predetermined intervals in the display area. The ribs 31 are formed at a predetermined interval and extend along the long sides of the organic EL elements 1. The organic EL display panel according to this embodiment is driven by the active scheme of controlling the direct current to be supplied to the organic EL elements by using thin-film transistors. In the organic EL display panel according to this embodiment, the storage capacitor 2, EL driving TFT 3, and switching TFT 4 are arranged in a light-emitting layer overlap region (non-aperture region) 9. In the light-emitting layer overlap region 9, color mixture occurs when light is emitted from the organic EL element 1 because the R, G, and B emitters are assumed to overlap, as will be described later. In the light-emitting layer overlap region 9, no image can be displayed in the display area of the organic EL display panel. The unit pixels 100 each having the above-described structure are arranged in a matrix form in the display area where an image is displayed.

Referring to FIGS. 1A and 1B, the organic EL element 1 is connected to the power supply line 5 through the p-channel EL driving TFT 3. The gate of the EL driving TFT 3 is connected to the signal line 7 through the switching TFT 4. The gate of the switching TFT 4 is connected to the scan line 6. The signal voltage supplied from the signal line 7 by the switching TFT 4 is on/off-controlled in accordance with the control voltage supplied from the scan line 6. When the switching TFT 4 is on, the signal voltage is supplied to the gate of the EL driving TFT 3. When the signal voltage exceeds a threshold value, the EL driving TFT 3 is turned on so that the direct current is supplied from the power supply line 5 to the organic EL element 1 through the EL driving TFT 3. Accordingly, light is emitted. When the switching TFT 4 is off, no signal voltage is supplied to the gate of the EL driving TFT 3. The EL driving TFT 3 is turned off so that no direct current is supplied from the power supply line 5 to the organic EL element 1 through the EL driving TFT 3. Hence, no light is emitted. The signal voltage from the signal line 7 changes depending on a change in video data. For this reason, the state of light emitted from the organic EL element 1 changes in accordance with the video data so that an image corresponding to the video data is displayed in the display area.

Figure 2:
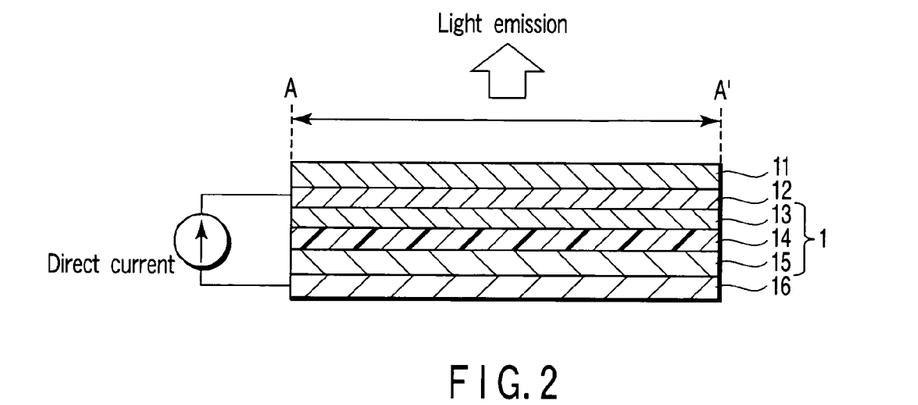
FIG. 2 is a sectional view showing the structure of an organic EL element formed in the unit pixel according to the embodiment.

FIG. 2 is a sectional view taken along a line A-A' in the organic EL element 1 shown in FIG. 1A. The organic EL element 1 includes a hole transporting layer 13, light-emitting layer 14, and electron transporting layer 15. The organic EL element 1 is arranged between a pixel electrode 12 and a common electrode 16. The pixel electrode 12 made of an ITO thin film is formed on a glass substrate 11 which extends over the display area. The hole transporting layer 13, light-emitting layer 14, electron transporting layer 15, and common electrode 16 made of a metal are formed on the pixel electrode 12 in this order. When a direct current is supplied to this structure, holes are emitted from the pixel electrode 12, and electrons are emitted from the common electrode 16. The holes and electrodes recombine in the light-emitting layer 14 and excite organic molecules in the light-emitting layer 14. Accordingly, light exits in the direction indicated by an arrow in FIG. 2.

Figure 3:
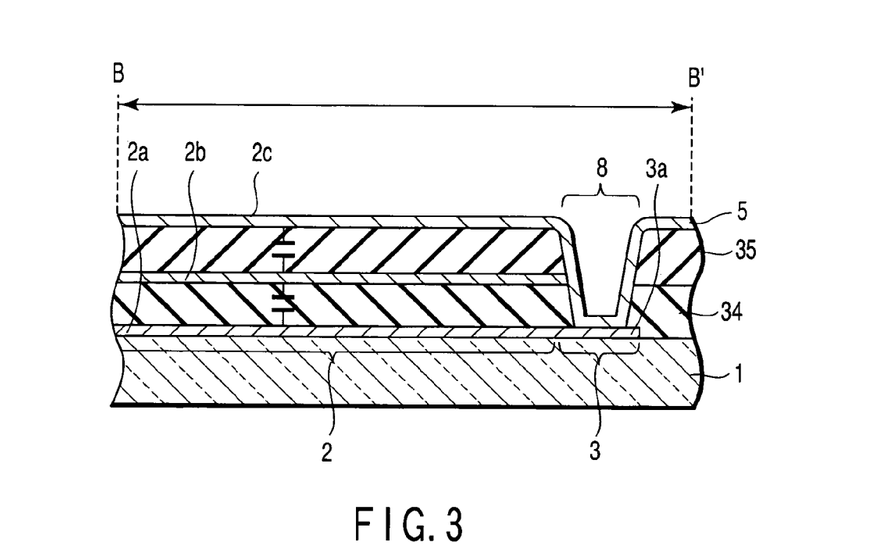
FIG. 3 is a sectional view showing the structure of a storage capacitor formed in the unit pixel shown in FIG. 1A.

FIG. 3 is a sectional view taken along a line B-B' in FIG. 1A. Referring to FIGS. 1A, 1B, and 3, the storage capacitor 2 includes an electrode 2a, electrode 2b, and electrode 2c. The electrode 2a is formed on the glass substrate 11. A source 3a of the EL driving TFT 3 is formed next to the electrode 2a. The electrode 2a is made of polysilicon and doped with P (phosphorus) ions to form n-type polysilicon. The electrode 2a and source 3a are formed integrally. A gate insulator 34 made of $SiO_2$ is formed to cover the electrode 2a and source 3a. The electrode 2b is formed on the gate insulator 34 to face the electrode 2a. An interlayer dielectric film 35 made of $SiO_2$ is formed to cover the electrode 2b. The electrode 2c is formed on the interlayer dielectric film 35 to face the electrode 2b. The power supply line 5 is formed next to the electrode 2c. The electrode 2c and power supply line 5 are electrically connected to the source 3a of the EL driving TFT 3 at a contact portion 8. Referring to FIG. 1A, the electrode 2b also serves as a gate interconnection which runs from the signal line 7 to the gate of the EL driving TFT 3 through the source and drain of the switching TFT 4. The EL driving TFT 3 has a multi-gate structure. When charge is stored between the electrode 2a and the electrode 2b and between the electrode 2b and the electrode 2c, a current amount necessary for causing the organic EL element 1 to emit light is set.

The organic EL display panel according to this embodiment performs full-color display. Hence, the unit pixels are arranged in the display area such that light is emitted in three primary colors, i.e., red (R), green, (G), and blue (B). As a coloring scheme, a three-color independent pixel scheme is employed, in which organic EL elements corresponding to R, G, and B are independently formed in the unit pixels.

The process of manufacturing the organic EL display panel according to this embodiment will be described below with reference to FIGS. 4A to 4F. The manufacturing process shown in FIGS. 4A to 4F schematically indicates that the unit pixels 100 each having the structure shown in FIG. 1 are formed adjacent to each other along the horizontal direction in the display area of the organic EL display panel. The organic EL elements 1 corresponding to R, G, and B are formed on the three adjacent unit pixels 100 shown in FIGS. 4A to 4F.

Figure 4A:
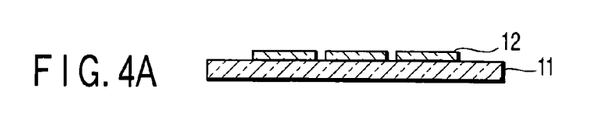
FIG. 4A is a sectional view showing a step of forming a pixel electrode on a glass substrate.
Figure 4B:
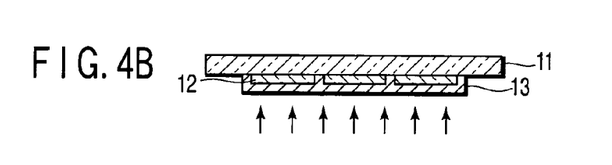
FIG. 4B is a sectional view showing a step of forming a hole transporting layer covering the pixel electrode on the glass substrate.

First, as shown in FIG. 4A, an ITO thin film is formed on a glass substrate 11 by evaporation or sputtering. The formed ITO thin film is separated into unit pixels by etching to form pixel electrodes 12. As shown in FIG. 4B, a hole transporting layer 13 is deposited on the entire surface of the glass substrate 11 by evaporation to cover the pixel electrodes 12. In parallel with the steps shown in FIGS. 4A and 4B, a storage capacitor 2 shown in FIG. 3 is formed in a light-emitting layer overlap region 9 shown in FIG. 1 by the process to be described later with reference to FIGS. 5A to 5G.

Figure 4C:
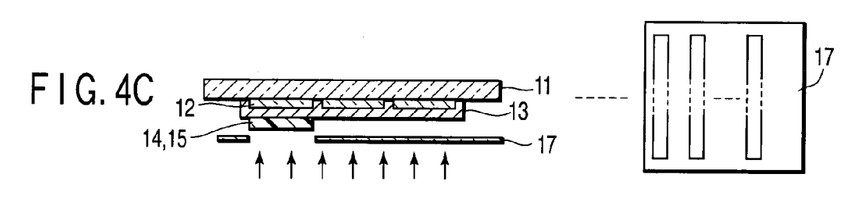
FIG. 4C is a sectional view showing a step of forming an R emitter (a light-emitting layer and an electron transporting layer) on the hole transporting layer.
Figure 4D:
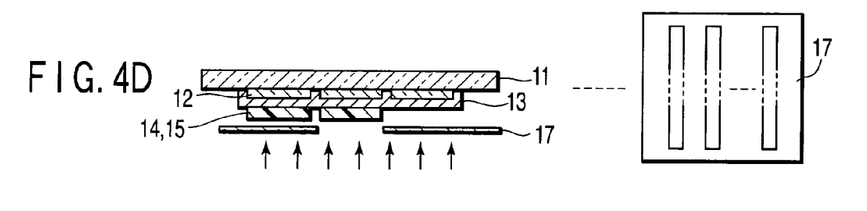
FIG. 4D is a sectional view showing a step of forming a G emitter on the hole transporting layer.
Figure 4E:
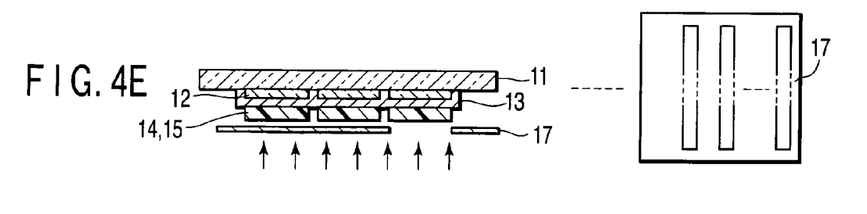
FIG. 4E is a sectional view showing a step of forming a B emitter on the hole transporting layer.

Next, as shown in FIGS. 4C to 4E (each square pattern shown on the right side indicates a metal mask 17 viewed from the upper side), the metal mask 17 having stripe-shaped opening portions is set on the hole transporting layer 13 side of the glass substrate 11. Vacuum evaporation is executed while sequentially sliding the metal mask 17 in the horizontal direction at a predetermined pitch P. Accordingly, emitter patterns (the light-emitting layer 14 and electron transporting layer 15 shown in FIG. 2) of R, G, and B are formed to face the pixel electrodes 12 with the hole transporting layer 13 interposed therebetween.

More specifically, as shown in FIG. 4C, the metal mask 17 is aligned such that stripe-shaped opening formed in the metal mask 17 is set along the pixel electrode 12 arranged on the left side in FIG. 4C. An emitter (the light-emitting layer 14 and electron transporting layer 15) of R is formed on the hole transporting layer 13 along the stripe-shaped opening formed in the metal mask 17 such that the emitter faces the pixel electrode 12 arranged on the left side.

Next, as shown in FIG. 4D, the metal mask 17 is slid in the horizontal direction at the predetermined pitch P such that the stripe-shaped opening formed in the metal mask 17 is set along, of the three pixel electrodes 12 shown in FIG. 4D, the pixel electrode 12 arranged at the center. An emitter (the light-emitting layer 14 and electron transporting layer 15) of G is formed on the hole transporting layer 13 along the stripe-shaped opening formed in the metal mask 17 such that the phosphor opposes the pixel electrode 12 arranged at the center.

Finally, as shown in FIG. 4E, the metal mask 17 is further slid in the horizontal direction at the predetermined pitch P such that the stripe-shaped opening formed in the metal mask 17 is set along, of the three pixel electrodes 12, the pixel electrode 12 arranged on the right side. An emitter (the light-emitting layer 14 and electron transporting layer 15) of B is formed on the hole transporting layer 13 along the stripe-shaped opening formed in the metal mask 17 such that the phosphor opposes the pixel electrode 12 arranged on the right side.

Figure 4F:
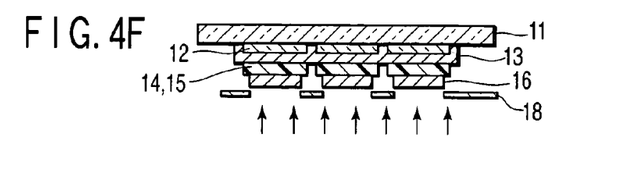
FIG. 4F is a sectional view showing a step of forming the pattern of a common electrode on the emitters.

Subsequently, as shown in FIG. 4F, the pattern of the common electrode 16 is formed on each electron transporting layer 15 by evaporation using a evaporation mask 18 such that the common electrode 16 faces each pixel electrode 12.

After that, a sealing plate (not shown) is bonded from the upper side of these structures formed on the glass substrate 11. Driving circuits (not shown) are mounted. An organic EL display panel is thus completed.

A process of forming the storage capacitor 2 will be described below with reference to FIGS. 5A to 5G. The formation process shown in FIGS. 5A to 5G indicates a process of forming the storage capacitor 2 shown in FIG. 3 in parallel with the steps shown in FIGS. 4A and 4B.

Figure 5A:
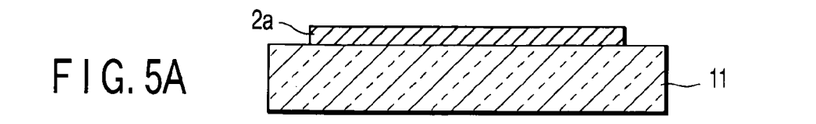
FIG. 5A is a sectional view showing a step of forming an electrode on the glass substrate.

First, as shown in FIG. 5A, in the light-emitting layer overlap region 9 on the glass substrate 11, an electrode 2a is formed by patterning a polysilicon.

Figure 5B:
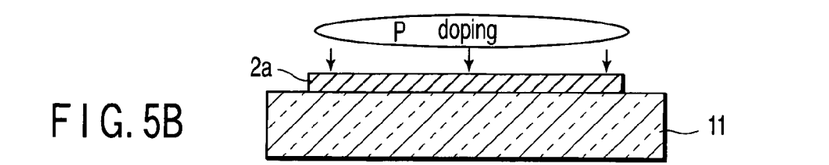
FIG. 5B is a sectional view showing a step of doping the electrode to form a p-type electrode.

As shown in FIG. 5B, the electrode 2a is doped with P (phosphorous) ions to form an n-type electrode (the electrode 2a may be doped with B (boron) ions to form a p-type electrode).

Figure 5C:
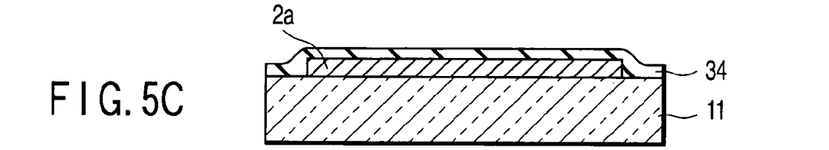
FIG. 5C is a sectional view showing a step of forming a gate insulator covering the electrode on the glass substrate.
Figure 5D:
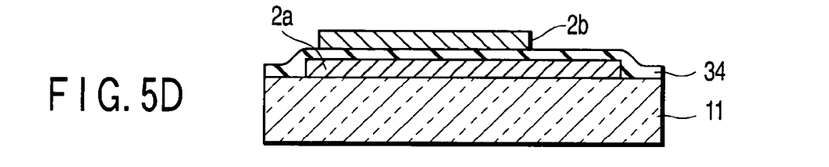
FIG. 5D is a sectional view showing a step of forming an electrode on the gate insulator.

As shown in FIG. 5C, a gate insulator 34 made of $SiO_2$ is formed to cover the electrode 2a. As shown in FIG. 5D, an electrode 2b is formed on the gate insulator 34 by patterning Mo (molybdenum)/Al (aluminum)/Mo (molybdenum) such that the electrode 2b faces the electrode 2a.

Figure 5E:
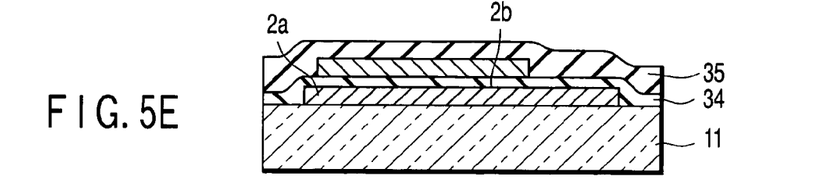
FIG. 5E is a sectional view showing a step of forming an interlayer dielectric film covering the electrode on the gate insulator.
Figure 5F:
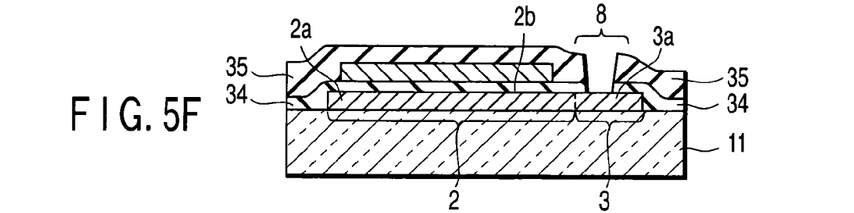
FIG. 5F is a sectional view showing a step of forming a contact portion which reaches the source of an EL driving TFT through part of the interlayer dielectric film.

As shown in FIG. 5E, an interlayer dielectric film 35 made of $SiO_2$ is formed on the gate insulator 34 to cover the electrode 2b. As shown in FIG. 5F, a contact portion 8 which reaches the source 3a of the EL driving TFT 3 through the gate insulator 34 and interlayer dielectric film 35 is formed. Referring to FIG. 3, a source 3a is formed integrally with the electrode 2a. The electrode 2a and electrode 2b form part of the storage capacitor 2.

Figure 5G:
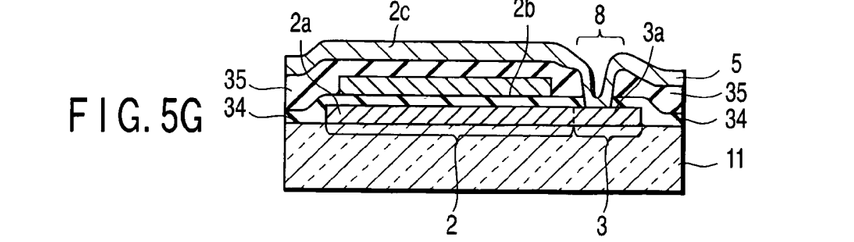
FIG. 5G is a sectional view showing a step of forming an electrode and a power supply line covering the interlayer dielectric film and contact portion.

As shown in FIG. 5G, an electrode 2c of the storage capacitor 2 and power supply line 5 made of MoW (molybdenum-tungsten) are formed on the interlayer dielectric film 35. The electrode 2c and power supply line 5 are electrically connected to the source 3a of the EL driving TFT 3 at the contact portion 8.

Figure 6:
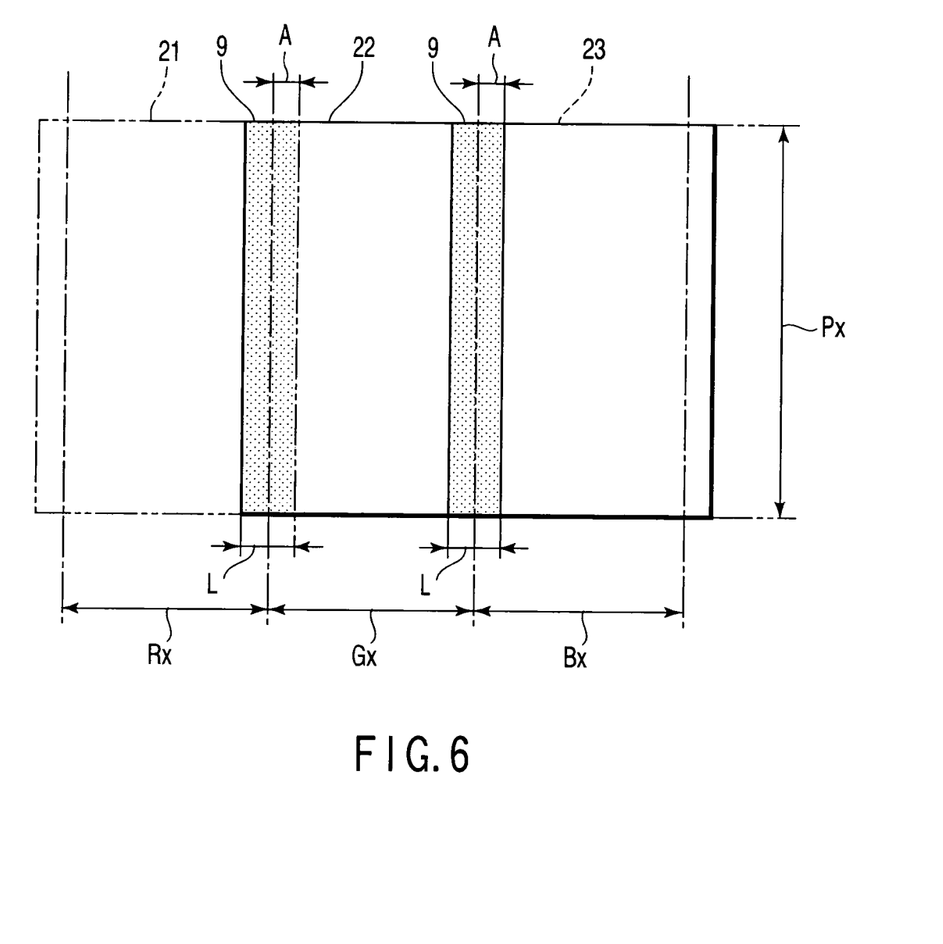
FIG. 6 is a schematic view showing a region in which the R, G, and B emitters (light-emitting layers and electron transporting layers) should be deposited in the display area of the organic EL display panel according to the embodiment.

FIG. 6 is a plan view of the region viewed from the light exit side, where the emitters (light-emitting layer 14 and electron transporting layer 15 shown in FIGS. 2 and 4C to 4F) of R, G, and B should be deposited by evaporation in the display area of the organic EL display panel. As shown in FIGS. 4C to 4E, when the metal mask 17 is sequentially slid in the horizontal direction at the pitch P, the R emitter is deposited in a region 21 (a region surrounded by an alternate long and two short dashes line), the G emitter is deposited in a region 22 (a region surrounded by a solid line), and the B emitter is deposited in a region 23 (a region surrounded by a broken line). If misalignment of the metal mask 17 occurs, the R, G, and B emitters overlap each other in the light-emitting layer overlap regions 9 (shaded regions). More specifically, the R emitter and G emitter overlap each other in the left one of the two light-emitting layer overlap regions 9 shown in FIG. 6. The G emitter and B emitter overlap each other in the right light-emitting layer overlap region 9.

The horizontal widths of unit pixels in which the R emitter, G emitter, and B emitter are deposited are Rx, Gx, and Bx, respectively. The vertical length of each unit pixel is Px. The horizontal width of the light-emitting layer overlap region 9 is L. The maximum length of misalignment of the metal mask 17 is A. When the emitters overlap in the light-emitting layer overlap region 9, so-called color mixture occurs in light which exits through the light-emitting layer overlap region 9. To avoid the color mixture, the light-emitting layer overlap region 9 is the region where no image can be displayed in the display area.

In the organic EL display panel according to this embodiment, as shown in FIG. 1, the storage capacitor 2, EL driving TFT 3, and switching TFT 4 are arranged in the light-emitting layer overlap region 9 in each unit pixel 100 of the display area. The EL driving TFT 3 and switching TFT 4 are arranged along the long side direction of the light-emitting layer overlap region 9.

Let S be the area occupied by the storage capacitor 2, EL driving TFT 3, and switching TFT 4. Referring to FIG. 6, the area of the light-emitting layer overlap region 9 is given by L×Px. When the storage capacitor 2, EL driving TFT 3, and switching TFT 4 are arranged in the light-emitting layer overlap region 9, S<L×Px. When a direct current is supplied to each unit pixel in this state, no light exits from the light-emitting layer overlap region 9 while light exits from the organic EL element 1.

According to this embodiment, in each unit pixel of the organic EL display panel, the storage capacitor 2, EL driving TFT 3, and switching TFT 4 are arranged in the light-emitting layer overlap region 9 where color mixture occurs in light which exits from the organic EL element 1. For this reason, the light emission area in each pixel can be made larger than that in the prior art. Even when the light emission amount per unit area is decreased, the same luminance as in the prior art can be obtained. For this reason, the amount of power to be supplied to each pixel can be suppressed. As a result, the life of the organic EL element can be longer than in the prior art.

In this embodiment, since the light emission area is larger than in the prior art, the luminance of a displayed image can be made higher than that in the prior art when the density of current supplied to each organic EL element is almost the same as in the prior art.

In the organic EL display panel, to implement a full-color display, the R emitter, G emitter, and B emitter must be deposited along the direction of the gate line while moving a predetermined mask by a predetermined amount along the direction of the gate line. To do this, it is essential to design the light-emitting layer overlap regions where the R emitter and G emitter, and the G emitter and B emitter, which are adjacent along the direction of the gate line, overlap each other as a mask alignment margin at the time of design. In a thus set light-emitting layer overlap region, no light can be emitted because color mixture occurs. This impedes an increase in aperture ratio.

In this embodiment, non-aperture elements such as the storage capacitor 2, EL driving TFT 3, and switching TFT 4 are arranged in the light-emitting layer overlap region where no light can be emitted. Hence, the aperture ratio can be increased on the whole in the organic EL display panel.

In this embodiment, the R, G, and B emitters are formed by evaporation. However, the present invention is not limited to this. The R, G, and B emitters may be formed by inkjet printing or offset printing.

Figure 7:
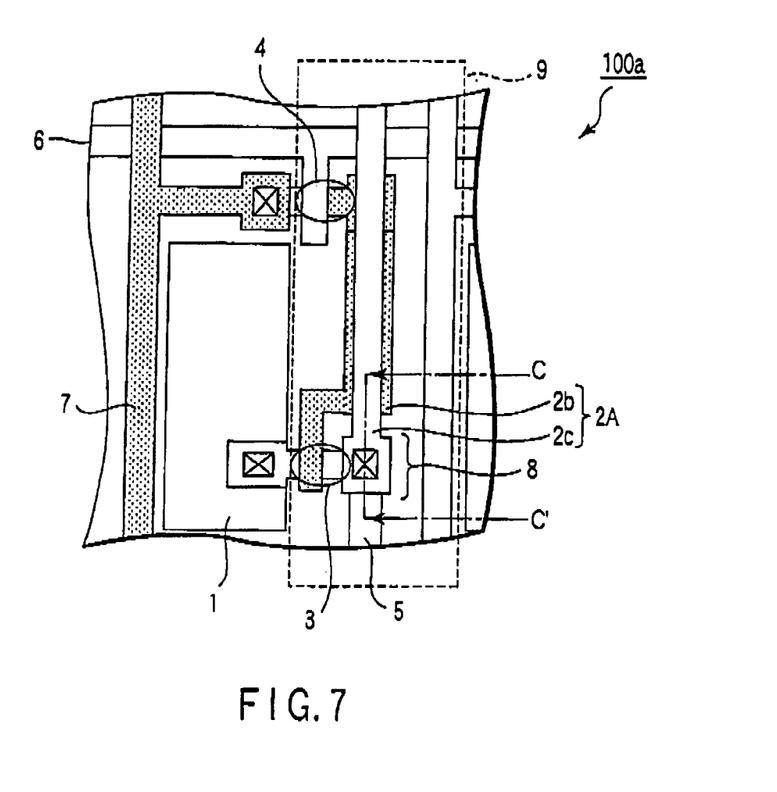
FIG. 7 is a plan view showing another structure of the unit pixel of the organic EL display panel according to the embodiment.
Figure 8:
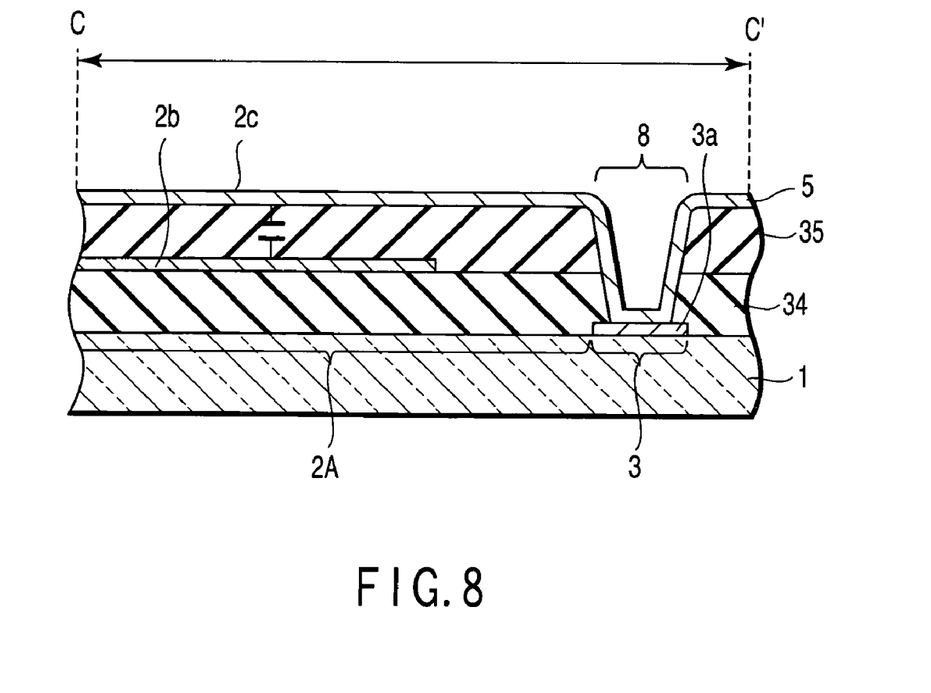
FIG. 8 is a sectional view showing the structure of the storage capacitor formed in the unit pixel shown in FIG. 7.

A unit pixel 100a in the organic EL display panel according to this embodiment may have the structure shown in FIG. 7. The same reference numerals as in FIG. 1A described above denote the same constituent elements in FIG. 7, and a description thereof will be omitted. The equivalent circuit diagram of the unit pixel 100a is the same as in FIG. 1B. FIG. 8 is a sectional view taken along a line C-C' in FIG. 7. In the storage capacitor 2 having the structure shown in FIG. 3 described above, charge is stored both between the electrode 2a and the electrode 2b and between the electrode 2b and the electrode 2c. In a storage capacitor 2A having the structure shown in FIGS. 7 and 8, charge is stored only between the electrode 2b and the electrode 2c. For this reason, the amount of charge stored in the storage capacitor 2A is smaller than that in the storage capacitor 2 having the structure shown in FIG. 3. The storage capacitor 2A having the structure shown in FIGS. 7 and 8 can be formed in accordance with the same procedures as described above except that in the step shown in FIG. 5A described above, only the portion serving as the source 3a of the EL driving TFT 3 is formed by patterning polysilicon.

Figure 9:
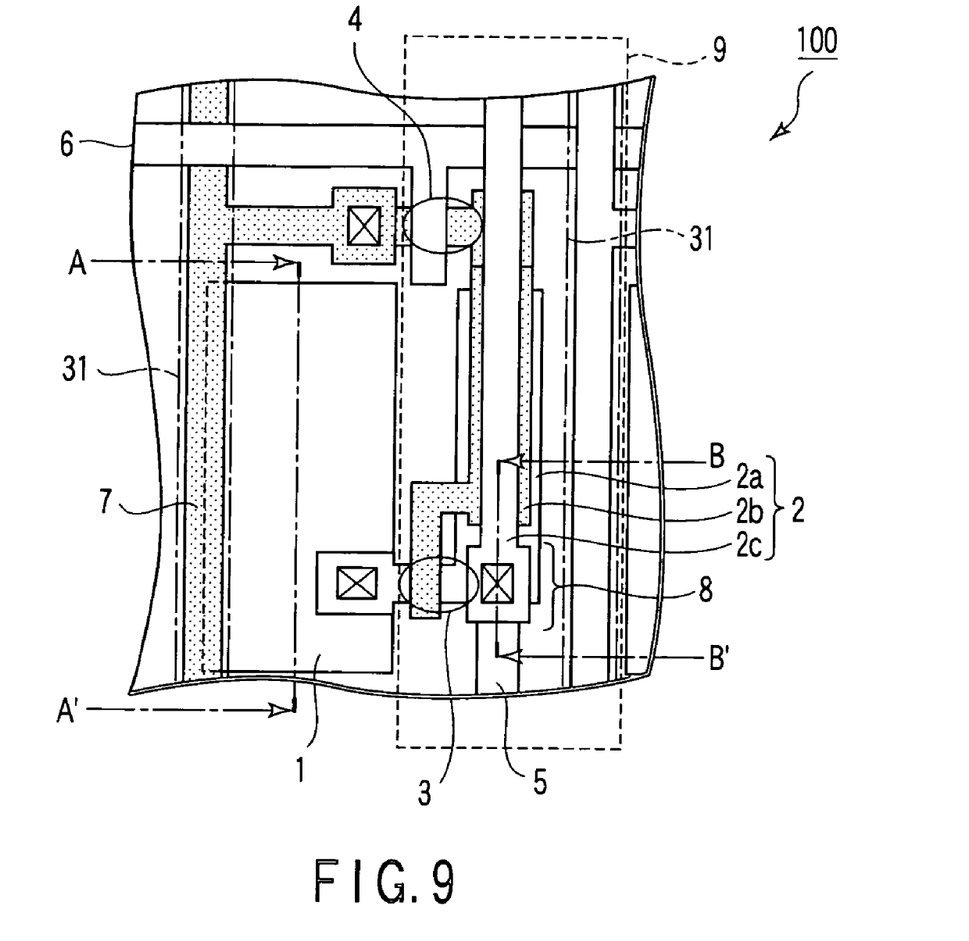
FIG. 9 is a plan view showing still another structure of the unit pixel of the organic EL display panel according to the embodiment.

FIG. 9 is a plan view showing the structure of still another unit pixel 100b of the organic EL display panel according to this embodiment. The same reference numerals as in the unit pixel 100 described above with reference to FIG. 1 denote the same constituent elements in FIG. 9, and a detailed description thereof will be omitted.

The unit pixel 100b is different from the above-described unit pixel 100 in having an organic EL element 1b in place of the organic EL element 1. As shown in FIG. 9, the organic EL element 1b partially overlaps the signal line 7. When the organic EL element 1b partially overlaps the signal line 7, the area of the organic EL element can be increased. Hence, the light emission area can further be increased.

In the above example, the organic EL element 1b overlaps the signal line 7. However, the present invention is not limited to this. The organic EL element 1b only needs to overlap at least one of the signal line 7, power supply line 5, and scan line 6.

In the organic EL display panel according to this embodiment, the power supply line 5 is arranged along the vertical direction in the display area. The power supply line 5 may be arranged along the horizontal direction by commonly using the scan line 6 as the power supply line 5.

When the organic EL display panel according to this embodiment is mounted in the image display section of a cellular phone, a cellular phone which has a long life while implementing highly precise image display by using organic EL elements can be obtained.

According to the present invention, an organic EL display panel having a longer life can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. An organic EL display panel comprising:
   a substrate;
   pixel electrodes which are arranged in a matrix form on the substrate;
   a common electrode which faces the pixel electrodes;
   signal lines which extend along a vertical direction and are arranged in a gate line direction at a predetermined interval;
   power supply lines which extend along the vertical direction and are arranged in the gate line direction at a predetermined interval;
   scan lines which extend along the gate line direction and are arranged in the vertical direction at a predetermined interval;
   organic EL elements which are arranged between the pixel electrodes and the common electrode and each of which emits light when a current flows between the pixel electrode and the common electrode;
   first thin-film transistors each of which is connected between the power supply line and the pixel electrode;
   storage capacitors each of which includes a first electrode connected to a gate of the first thin-film transistor; and
   second thin-film transistors each of which is connected between the signal line and the gate of the first thin-film transistor,
   wherein, to obtain a full color image by light emissions of the organic EL elements, a red (R) emitter, a green (G) emitter and a blue (B) emitter are patterned correspondently with the pixel electrodes and arranged in this order along the gate line direction,
   wherein the emitters are patterned such that each pair of the red (R) emitter, the green (G) emitter and the blue (B) emitter which are adjacent to each other along the gate line direction overlap each other to define a light-emitting layer overlap region, where colors of light components which exit the organic EL elements and pass through the emitters are mixed, between the adjacent organic EL elements arranged along the gate line direction, and
   wherein at least one of the first thin-film transistor, the second thin film transistor and the storage capacitor is placed in the light-emitting layer overlap region.

2. An organic EL display panel comprising:
   a substrate;
   pixel electrodes which are arranged in a matrix form on the substrate;
   a common electrode which faces the pixel electrodes;
   signal lines which extend along a vertical direction and are arranged in a gate line direction at a predetermined interval;
   power supply lines which extend along the vertical direction and are arranged in the gate line direction at a predetermined interval;
   scan lines which extend along the gate line direction and are arranged in the vertical direction at a predetermined interval;
   organic EL elements which are arranged between the pixel electrodes and the common electrode and each of which emits light when a current flows between the pixel electrode and the common electrode;

first thin-film transistors each of which is connected between the power supply line and the pixel electrode;

storage capacitors each of which includes a first electrode connected to a gate of the first thin-film transistor; and second thin-film transistors each of which is connected between the signal line and the gate of the first thin-film transistor, wherein each of the organic EL elements is placed to overlap at least one of the signal line, the power supply line, and the scan line, and wherein at least one of the first thin-film transistor, the second thin-film transistor and the storage capacitor is placed in a non-aperture region between the adjacent pixel electrodes.

3. An organic EL display panel comprising:

a substrate;

pixel electrodes which are arranged in a matrix form on the substrate;

a common electrode which faces the pixel electrodes;

signal lines which extend along a vertical direction and are arranged in a gate line direction at a predetermined interval;

power supply lines which extend along the vertical direction and are arranged in the gate line direction at a predetermined interval;

scan lines which extend along the gate line direction and are arranged in the vertical direction at a predetermined interval;

organic EL elements which are arranged between the pixel electrodes and the common electrode and each of which emits light when a current flows between the pixel electrode and the common electrode;

storage capacitors each of which includes a first electrode connected to a gate of the first thin-film transistor, and second thin-film transistors each of which is connected between the signal line and the gate of the first thin-film transistor, wherein, to obtain a full color image by light emissions of the organic EL elements, a red (R) emitter, a green (G) emitter and a blue (B) emitter are patterned correspondently with the pixel electrodes and arranged in this order along the gate line direction, wherein the emitters are patterned such that each pair of the red (R) emitter, the green (G) emitter and the blue (B) emitter which are adjacent to each other along the gate line direction overlap each other to define a light-emitting layer overlap region with a rectangular shape extending along the vertical direction, where colors of light components which exit the organic EL elements and pass through the emitters are mixed, between the adjacent organic EL elements arranged along the gate line direction, wherein at least one of the first thin-film transistor, the second thin-film transistor and the storage capacitor is placed in the light-emitting layer overlap region, and wherein each of the organic EL elements is placed to overlap at least one of the signal line, the power supply line, and the scan line.

4. The organic EL display panel according to any one of claims 1 to 3, wherein at least two of the first thin-film transistor, the second thin-film transistor and the storage capacitor are arranged along the vertical direction.

5. The organic EL display panel according to any one of claims 1 to 3, wherein the red (R) emitter, the green (G) emitter and the blue (B) emitter are elongated along the vertical direction to form a stripe.

6. The organic EL display panel according to any one of claims 1 to 3, wherein each of the organic EL elements has a rectangular shape extending along the vertical direction, and wherein the light-emitting layer overlap region or the non-aperture region extends along a long side direction of the organic EL element while being centered almost at an intermediate point between the organic EL elements adjacent to each other.

7. The organic EL display panel according to any one of claims 1 to 3, wherein a relationship $S<P\times L$ is satisfied, where P is a length of each unit pixel along the vertical direction, L is a length of the light-emitting layer overlap region or the non-aperture region along the gate line direction, and S is an area occupied by said at least one of the first thin-film transistor, the second thin-film transistor and the storage capacitor placed in the light-emitting layer overlap region or the non-aperture region.

8. The organic EL display panel according to claim 7, wherein the length L corresponds to a width of a rib formed between the adjacent emitters.

9. The organic EL display panel according to any one of claims 1 to 3, wherein the first electrode is at least a portion of a gate interconnection which connects a source or drain of the second thin-film transistor to the gate of the first thin-film transistor, each of the storage capacitors further includes a second electrode which is made of polysilicon and formed integrally with a source of the first thin-film transistor, and a third electrode as a portion of the power supply line, the first electrode faces the second electrode and the third electrode and is sandwiched therebetween, and charges are stored between the first electrode and the second electrode and between the first electrode and the third electrode.

10. The organic EL display panel according to any one of claims 1 to 3, wherein the red (R) emitter, green (G) emitter, and blue (B) emitter are formed by mask evaporation.

* * * * *